US009947419B1

(12) United States Patent
Sinha et al.

(10) Patent No.: US 9,947,419 B1
(45) Date of Patent: Apr. 17, 2018

(54) APPARATUS AND METHOD FOR IMPLEMENTING DESIGN FOR TESTABILITY (DFT) FOR BITLINE DRIVERS OF MEMORY CIRCUITS

(71) Applicant: QUALCOMM Incorporated, San Diego, CA (US)

(72) Inventors: Rakesh Kumar Sinha, Bangalore (IN); Priyankar Mathuria, Bangalore (IN); Sharad Kumar Gupta, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/472,121

(22) Filed: Mar. 28, 2017

(51) Int. Cl.
*G11C 29/50* (2006.01)
*G11C 29/12* (2006.01)
*G11C 11/419* (2006.01)

(52) U.S. Cl.
CPC ........ *G11C 29/1201* (2013.01); *G11C 11/419* (2013.01); *G11C 2029/1204* (2013.01)

(58) Field of Classification Search
CPC .............. G11C 29/1201; G11C 11/419; G11C 2029/1204
USPC .......................................................... 365/156
See application file for complete search history.

(56) References Cited

U.S. PATENT DOCUMENTS

| 5,675,545 | A | 10/1997 | Madhavan et al. |
| 7,639,056 | B2 * | 12/2009 | Gururajarao ..... H03K 3/356008 327/202 |
| 8,817,520 | B2 | 8/2014 | Khanna et al. |
| 8,897,088 | B2 | 11/2014 | Bartling et al. |
| 9,087,592 | B2 | 7/2015 | Sohn |
| 2014/0075087 | A1 | 3/2014 | Bartling et al. |

* cited by examiner

*Primary Examiner* — Han Yang
*Assistant Examiner* — Xiaochun L Chen
(74) *Attorney, Agent, or Firm* — Loza & Loza, LLP/Qualcomm

(57) ABSTRACT

A first bitline driver includes a multiplexer for outputting data and write mask signals in functional mode, and test vector signal in test mode; a latch to latch the data signal in functional mode and the test vector signal in test mode; a latch to latch the write mask signal in functional mode and the test vector signal in test mode; a latch to latch the test vector signal and provide it to a scan output; and a write circuit for writing data to a memory cell based on the data signal. A second bitline driver includes a latch to latch a data signal in functional mode if a write mask signal is deasserted and to latch a test vector signal in test mode; a latch to latch the test vector signal and provide it to a scan output; and a write circuit for writing data to a memory cell.

20 Claims, 6 Drawing Sheets

APPARATUS AND METHOD FOR IMPLEMENTING DESIGN FOR TESTABILITY (DFT) FOR BITLINE DRIVERS OF MEMORY CIRCUITS

BACKGROUND

Field

Aspects of the present disclosure relate generally to memory circuits, and in particular, to an apparatus and method for implementing design for testability (DFT) for bitline drivers of memory circuits.

Background

A memory circuit typically includes a two-dimensional array of memory cells. Memory cells common to rows (or columns) are coupled to a set of wordlines, respectively. Memory cells common to columns (or rows) are coupled to a set of complementary bitlines, respectively.

The memory circuit typically includes a wordline driver for selecting target memory cells upon which a data write or read operation will be performed. The wordline driver performs this selection by generating an asserted signal on the wordline coupled to the target memory cells, and generating deasserted signals on the remaining wordlines of the set. The asserted signal on the wordline causes the target memory cells to be coupled to complementary bitlines, respectively.

For reading data from the memory array, the memory circuit includes a sense amplifier coupled to the set of complementary bitlines. When the wordline driver selects a row (or column) of target memory cells for reading data therefrom, the sense amplifier senses the data on the complementary bitlines. The sense amplifier then reads out the data and provides it to a data output port.

For writing data into the memory array, the memory circuit includes a set of bitline drivers for generating data signals on the complementary bitlines for writing data into target memory cells, respectively. Each bitline driver of the set includes a data input port for receiving a data signal for writing data to the target memory cell. Each bitline driver of the set includes a write mask input port for receiving a write mask signal for masking the writing of data to a memory cell even if a data signal is present at the data input port.

This disclosure pertains to bitline drivers for improved functional and test mode operations.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a first latch configured to latch a data signal in response to a first state of a clock signal if a scan shift signal is deasserted, and latch a test vector signal in response to the first state of the clock signal if the scan shift signal is asserted; and a second latch configured to latch a write mask signal in response to the first state of the clock signal if the scan shift signal is deasserted, and latch the test vector signal in response to the first state of the clock signal if the scan shift signal is asserted.

Another aspect of the disclosure relates to a method including latching a data signal at a first node in response to a first state of a clock signal if a scan shift signal is deasserted; latching a test vector signal at the first node in response to the first state of the clock signal if the scan shift signal is asserted; latching a write mask signal at a second node in response to the first state of the clock signal if the scan shift signal is deasserted; and latching the test vector signal at the second node in response to the first state of the clock signal if the scan shift signal is asserted.

Another aspect of the disclosure relates to an apparatus including a first latch configured to latch a data signal in response to a first state of a clock signal if a write mask signal and a scan shift signal are deasserted, and latch a test vector signal in response to the first state of the clock signal if the scan shift signal is asserted; and a second latch configured to latch the test vector signal from the first latch in response to a second state of the clock signal if the scan shift signal is asserted.

Another aspect of the disclosure relates to a method including latching a data signal at a first node in response to a first state of a clock signal if a write mask signal and a scan shift signal are deasserted; latching a test vector signal at the first node in response to the first state of the clock signal if the scan shift signal is asserted; and latching the test vector signal at a second node in response to a second state of the clock signal if the scan shift signal is asserted.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
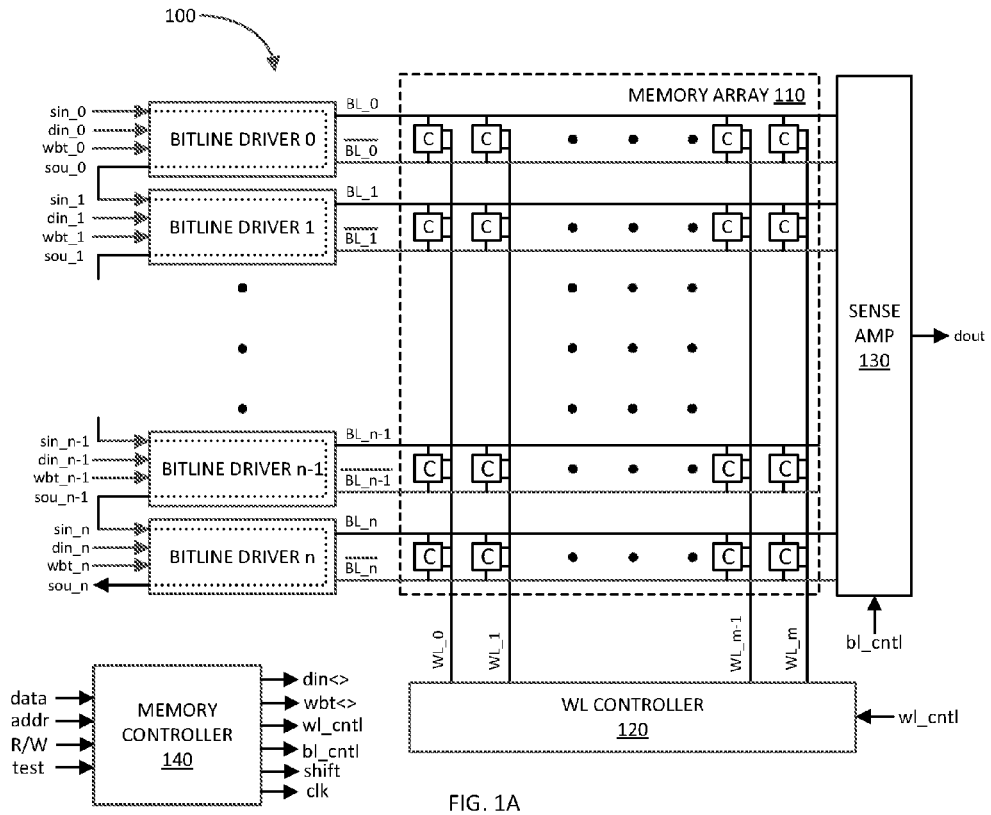
FIG. 1A illustrates a block diagram of an exemplary memory circuit in accordance with an aspect of the disclosure.

FIG. 1A illustrates a block diagram of an exemplary memory circuit 100 in accordance with an aspect of the disclosure. The memory circuit 100 includes a memory array 110 of memory cells (C). In this example, the memory array 110 is configured as a two-dimensional array having a dimension of (n+1) by (m+1) memory cells (C). As discussed further herein, each memory cell (C) may be configured as a static random access memory (SRAM) type memory cell, or other type of memory cell.

The memory circuit 100 further includes a word line (WL) controller 120 for generating asserted signals on a set of wordlines WL_0 to WL_m based on a control signal wl_cntl for accessing one or more memory cells (C) coupled to the asserted wordlines, respectively. As illustrated, the wordlines WL_0 to WL_m are coupled to columns of memory cells (C), respectively.

The memory circuit 100 further includes a set of bitline drivers 0 to n for generating complementary signals for writing data into rows of memory cells (C) coupled to complementary bitlines BL_0/$\overline{BL\_0}$ to BL_n/$\overline{BL\_n}$, respectively. The bitline drivers 0 to n include data input ports din_0 to din_n for receiving data for writing data to memory cells (C) coupled to the corresponding bitlines BL_0/$\overline{BL\_0}$ to BL_n/$\overline{BL\_n}$, respectively. The bitline drivers 0 to n include write mask input ports wbt_0 to wbt_n for receiving write mask signals for masking the writing of data to memory cells (C) coupled to bitlines BL_0/$\overline{BL\_0}$ to BL_n/$\overline{BL\_n}$, respectively.

In order to implement design for testability (DFT) for testing the operation of the bitline drivers 0 to n, the bitline driver 0 includes a scan input port sin_0 for receiving a test vector signal from an external test equipment, and the bitline driver n includes a scan output port sou_n for outputting a captured test vector signal to the external test equipment. The scan path is routed from the scan input port sin_0 to the scan output port sou_n consecutively via all of the bit line drivers 0 to n. For instance, as illustrated, the bitline driver 0 includes a scan output port sou_0 coupled to the scan input port sin_1 of bitline driver 1. Similarly, the bitline driver n−1 includes a scan output port sou_n−1 coupled to the scan input port sin_n of bitline driver n.

In general, for any intermediate bitline driver (where its position index k in the chain is not 0 or n), the $k^{th}$ bitline driver includes a scan input port sin_k coupled to the scan output port sin_k−1 of the $k^{th}$−1 bitline driver, and a scan output port sou_k coupled to the scan input port sin_k+1 of the $k^{th}$+1 bitline driver.

For reading data from the memory array 110, the memory circuit 100 further includes a sense amplifier 130 including a set of complementary inputs coupled to the set of complementary bitlines BL_0/$\overline{BL\_0}$ to BL_n/$\overline{BL\_n}$, respectively. The sense amplifier 130 further includes another input for receiving a control signal bl_cntl for enabling the reading of data from the memory cells (C). Additionally, the sense amplifier 130 includes a data output port dout for outputting the read data.

For controlling the writing and reading of data to and from the memory array 110 and the testing the bitline drivers 0 to n, the memory circuit 100 further includes a memory controller 140. The memory controller 140 includes: an input for receiving data to be written into the memory array 110; an input for receiving an address signal for identifying target memory cells (C) of the memory array 110 to or from which data is to be written or read; an input for receiving a read/write (R/W) control signal for specifying whether the current memory operation is a read or write operation; and an input for receiving a test signal for operating the bitline drivers 0 to n in test mode.

In response to the aforementioned inputs, the memory controller 140 generates data signals din< > (din_0 to din_n) and write mask signals wbt< > (wbt_0 to wbt_n) for the bitline drivers 0 to n, wl_cntl control signal for the wordline (WL) controller 120, bl_cntl control signal for the sense amplifier 130, and shift and clock (clk) signals for the bitline drivers 0 to n, as discussed in more detail herein.

The writing of data into memory circuit 100 may operate as follows: In this example, the writing of data into one or more memory cells (C) coupled to wordline WL_0 is discussed. It shall be understood that the writing of data into one or more memory cells (C) coupled to other wordlines operates in a similar manner.

For instance, if data is to be written into all of the memory cells (C) coupled to wordline WL_0, the corresponding write mask signals wbt_0 to wbt_n are deasserted (e.g., at a logic zero (0) voltage level) so that the writing of data to the memory cells (C) is not masked. The particular data to be written into the memory cells (C) are applied to the data input ports din_0 to din_n. Additionally, based on the control signal wl_cntl, the WL controller 120 generates an asserted signal on the wordline WL_0 to couple the corresponding memory cells to the bitlines BL_0/$\overline{BL\_0}$ to BL_n/$\overline{BL\_n}$ (and generates deasserted signals on all remaining wordlines WL_1 to WL_m so that the corresponding memory cells are not coupled to bitlines BL_0/$\overline{BL\_0}$ to BL_n/$\overline{BL\_n}$). Based on the deasserted mask signals wbt_0 to wbt_n and the input data signals din_0 to din_n, the bit line drivers 0 to n write the corresponding data into the memory cells (C).

For example, if a logic one (1) is to be written into the memory cell (C) coupled to the wordline WL_0 and complementary bitlines BL_0/$\overline{BL\_0}$, the wordline (WL) controller 120 generates an asserted signal (e.g., at a logic one (1) voltage level) on the wordline WL_0 (and generates deasserted signals (e.g., at logic zero (0) voltage levels) on the remaining wordlines WL_1 to WL_m), and the bitline driver 0 generates a logic one (1) voltage level on bitline BL_0 and a logic zero (0) voltage level on complementary bitline $\overline{BL\_0}$. If a logic zero (0) is to be written into the same memory cell (C), the wordline (WL) controller 120 generates the same asserted and deasserted signals, and the bitline driver 0 generates a logic zero (0) voltage level on bitline BL_0 and a logic one (1) voltage level on complementary bitline $\overline{BL\_0}$.

If the writing of data into one or more memory cells coupled to the bitlines BL_0/$\overline{BL\_0}$ to BL_n/$\overline{BL\_n}$ is to be masked or suppressed (even though the data signal is present in the corresponding data input port(s)), the corresponding mask signal(s) is/are asserted (e.g., at a logic one (1) voltage level).

The reading of data from memory circuit 100 may operate as follows: In this example, the reading of data from memory cells (C) coupled to wordline WL_0 is discussed. It shall be understood that the reading of data from memory cells (C) coupled to other word lines operates in a similar manner.

The sense amplifier 130 precharges the complementary bitlines BL_0/$\overline{BL\_0}$ to BL_n/$\overline{BL\_n}$ with a high logic voltage based on the bl_cntl control signal. Based on the control signal wl_cntl indicating that the memory cells (C) coupled to wordline WL_0 is to be read, the WL controller 120 generates an asserted signal on the wordline WL_0 to couple the corresponding memory cells to the bitlines BL_0/$\overline{BL\_0}$ to BL_n/$\overline{BL\_n}$ (and generates deasserted signals on all remaining wordlines WL_1 to WL_m so that the corresponding memory cells are not coupled to bitlines BL_0/$\overline{BL\_0}$ to BL_n/$\overline{BL\_n}$. The precharged complementary bitlines BL_0/$\overline{BL\_0}$ to BL_n/$\overline{BL\_n}$ change logic states depending on the data stored by the corresponding memory cells (C). The sense amplifier 130 senses the logic states on the complementary bitlines BL_0/$\overline{BL\_0}$ to BL_n/$\overline{BL\_n}$ to read out and produce the data at the data output port dout.

The testing of the bitlines drivers may operate as follows: In response to the test signal indicating a scan shift test mode, the memory controller 140 generates an asserted scan shift signal (e.g., at a high logic voltage). A test vector signal from an external test equipment (not shown) is applied to the scan input sin_0 of the bitline driver 0. And, the memory controller 140 generates a clock signal clk at a relatively low frequency (e.g., shift mode frequency) to accurately cause the test vector signal to propagate from bitline driver 0 to bitline driver n.

In response to the test signal indicating a scan capture test mode, the memory controller 140 generates a deasserted scan shift signal (e.g., at a low logic voltage) and generates the clock signal (clk) at a relatively high frequency (e.g., functional mode frequency or frequency at which latches of the bitline driver will be tested). The test vector signal is then captured by the corresponding latches of the bitline drivers 0 to n.

Then, in response to the test signal again indicating a scan shift testing mode, the memory controller 140 generates the asserted scan shift signal and the clock signal clk at the relatively low frequency (e.g., shift mode frequency) to accurately shift out the captured test vector signal from the bitline drivers 0 to n to the external test equipment via the scan output port sou_n of bitline driver n. Based on the input test vector signal and the captured test vector signal, the test equipment is able to determine operational errors in the bitline drivers 0 to n.

Figure 1B:
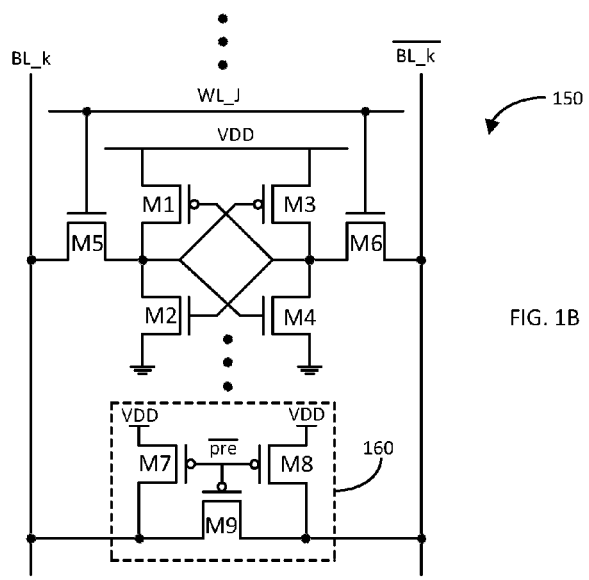
FIG. 1B illustrates a schematic diagram of an exemplary memory cell and precharge circuit in accordance with another aspect of the disclosure.

FIG. 1B illustrates a schematic diagram of an exemplary memory cell 150 and a corresponding precharge circuit 160 in accordance with another aspect of the disclosure. As discussed above, each memory cell (C) of the memory circuit 100 may be configured as an SRAM type memory cell. In this example, the memory cell 150 is coupled to the $j^{th}$ wordline WL_j and the $k^{th}$ complementary bitlines BL_k/$\overline{BL\_k}$.

Accordingly, the memory cell 150 includes a first inverter having a p-channel metal oxide semiconductor (PMOS) field effect transistor (FET) M1 coupled in series with an n-channel metal oxide semiconductor (NMOS) FET M2 between an upper voltage rail (VDD) and a lower voltage rail (e.g., ground). The memory cell 150 further includes a second inverter including a PMOS FET M3 coupled in series with an NMOS FET M4 between the upper voltage rail (VDD) and the lower voltage rail (ground).

The first and second inverters are cross-coupled. That is, the output of the first inverter (at the drains of FETs M1 and M2) is coupled to the input (at the gates of FETs M3 and M4) of the second inverter, and the output of the second inverter (at the drains of FETs M3 and M4) is coupled to an input (at the gates of FETs M1 and M2) of the first inverter.

The memory cell 150 further includes access NMOS FETs M5 and M6 with gates coupled to the corresponding wordline WL_j, drain/source coupled to the complementary bitlines BL_k/$\overline{BL\_k}$, and source/drain coupled to the outputs of the first and second inverters, respectively. As noted by the ellipsis above and below the memory cell 150, other similarly structured memory cells are coupled to the complementary bitlines BL_k/$\overline{BL\_k}$.

As mentioned above, each pair of complementary bitlines BL_k/$\overline{BL\_k}$ includes a corresponding precharge circuit 160 for precharging the bitlines pursuant to a read operation. In this example, the precharge circuit 160 includes a PMOS FET M7 coupled between the upper voltage rail (VDD) and bitline BL_k; a PMOS FET M8 coupled between the upper voltage rail (VDD) and complementary bitline $\overline{BL\_k}$; and a PMOS FET M9 coupled between the complementary bitlines BL_k/$\overline{BL\_k}$.

The sense amplifier 130 generates an asserted precharge signal ($\overline{pre}$) (e.g., at a low logic voltage level) in order to precharge the complementary bitlines BL_k/$\overline{BL\_k}$ pursuant to a read operation. That is, the asserted precharge signal ($\overline{pre}$) turns on FETs M7, M8, and M9 to couple the upper voltage rail (VDD) to the complementary bitlines BL_k/$\overline{BL\_k}$ to effectuate their precharging. After the bitlines BL_k/$\overline{BL\_k}$ has been precharged, the precharge signal (pre) is deasserted to turn off the FETs M7, M8, and M9 and decouple the upper voltage rail (VDD) from the bitlines BL_k/$\overline{BL\_k}$.

Figure 2:
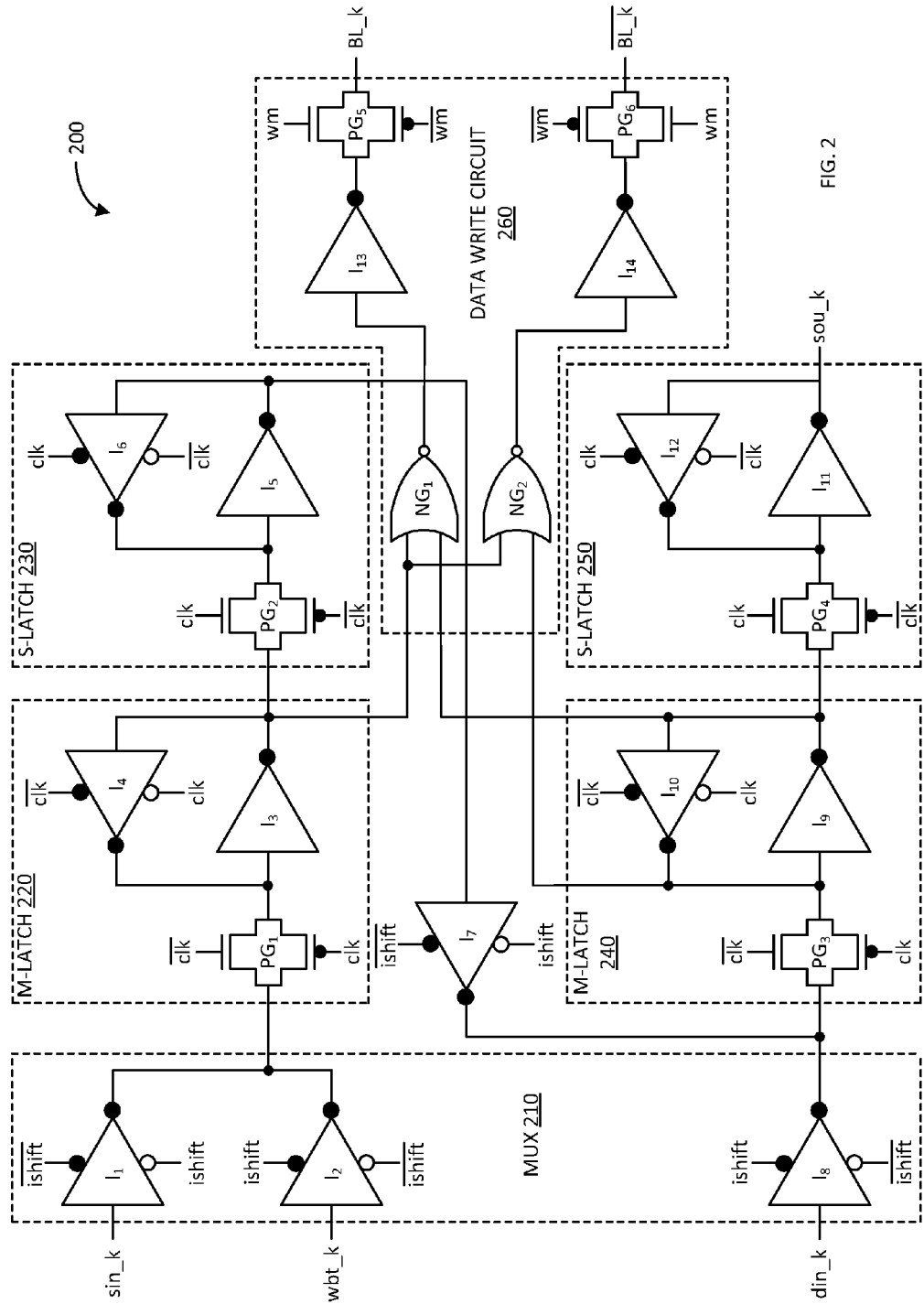
FIG. 2 illustrates a schematic diagram of an exemplary bitline driver in accordance with another aspect of the disclosure.

FIG. 2 illustrates a schematic diagram of an exemplary bitline driver 200 in accordance with another aspect of the disclosure. The bitline driver 200 may be an example of one of the bitline drivers 0 to n of memory circuit 100 previously discussed. For instance, the bitline drive 200 may be the $k^{th}$ bitline driver of the bitline drivers 0 to n.

In particular, the bit line driver 200 includes a multiplexer 210 with tristate inverters $I_1$, $I_2$, and $I_8$ (generally, gating devices); a first master-latch 220 including a pass gate $PG_1$, inverter $I_3$ and tristate inverter $I_4$; a first slave-latch 230 including a pass gate $PG_2$, inverter $I_5$ and tristate inverter $I_6$; tristate inverter $I_7$; a second master-latch 240 including a pass gate $PG_3$, inverter $I_9$ and tristate inverter $I_{10}$; and a second slave-latch 250 including a pass gate $PG_4$, inverter $I_{11}$ and tristate inverter $I_{12}$. The bit line driver 200 further includes a data write circuit 260 including first and second NOR-gates $NG_1$ and $NG_2$, inverters $I_{13}$ and $I_{14}$, and pass gates $PG_5$ and $PG_6$ coupled to complementary bitlines BL_k/$\overline{BL\_k}$. A column of memory cells (C) and a corresponding precharge circuit (both not shown in FIG. 2) are coupled to complementary bitline BL_k/$\overline{BL\_k}$, as previously discussed with respect to FIG. 1.

The tristate inverter $I_1$ of the multiplexer 210 includes an input coupled to a scan input port sin_k for receiving a test vector signal. The scan input port sin_k is coupled to the scan output sou_k−1 of the $k^{th}$−1 bit line driver if it is not bitline driver 0 or to an external input port if it is bitline driver 0. The tristate inverter $I_1$ is enabled (outputs an inverted input signal) and disabled (produces a tristated output) based on complementary shift signals ishift/$\overline{ishift}$ (e.g., enabled if ishift=1 and $\overline{ishift}$=0, and disabled if ishift=0 and $\overline{ishift}$=1).

The tristate inverter $I_2$ of the multiplexer 210 includes an input coupled to the write mask port wbt_k. The tristate inverter $I_2$ is enabled and disabled based on complementary shift signals ishift/$\overline{ishift}$ (e.g., enabled if ishift=0 and $\overline{ishift}$=1, and disabled if ishift=1 and $\overline{ishift}$=0). The outputs of the tristate inverters $I_1$ and $I_2$ are coupled together and to an input of the first master-latch 220 (in particularly, to the input of the pass gate $PG_1$).

The pass gate $PG_1$ of the master-latch 220 is enabled (passes its input signal) and disabled (does not pass its input signal) based on complementary clock signals clk/$\overline{clk}$ (e.g., enabled if clk=0 and $\overline{clk}$=1, and disabled if clk=1 and $\overline{clk}$=0). The output of the pass gate $PG_1$ is coupled to the input and output of inverters $I_3$ and $I_4$ of the master-latch 220, respectively. The inverters $I_3$ and $I_4$ (serving as the latch mechanism of the master-latch 220) are enabled (cross-coupled for latching signal) and disabled (not cross-coupled for not latching signal) based on complementary clock signals clk/$\overline{clk}$ (e.g., enabled if clk=1 and $\overline{clk}$=0, and disabled if clk=0 and $\overline{clk}$=1). The output of the first master-latch 220 (at the input and output of inverters $I_4$ and $I_3$, respectively) is coupled to an input of the first slave-latch 230 (in particularly, to the input of pass gate $PG_2$) and respective first inputs of NOR-gates $NG_1$ and $NG_2$ of the data write circuit 260.

The second pass gate $PG_2$ of the first slave-latch 230 is enabled and disabled based on complementary clock signals clk/$\overline{clk}$ (e.g., enabled if clk=1 and $\overline{clk}$=0, and disabled if clk=0 and $\overline{clk}$=1). The output of the second pass gate $PG_2$ is coupled to input and output of inverters $I_5$ and $I_6$, respectively. The inverters $I_5$ and $I_6$ (serving as the latch mechanism of the slave-latch 243) are enabled and disabled based on complementary clock signals clk/clk (e.g., enabled if clk=0 and $\overline{clk}$=1, and disabled if clk=1 and $\overline{clk}$=0). The output of the first slave-latch 230 (at the input and output of inverters $I_6$ and $I_5$, respectively) is coupled to an input of tristate inverter $I_7$.

The tristate inverter $I_7$ is enabled and disabled based on complementary shift signals ishift/$\overline{ishift}$ (e.g., enabled if ishift=1 and $\overline{ishift}$=0, and disabled if ishift=0 and $\overline{ishift}$=1). The output of the tristate inverter $I_7$ is coupled to an input of the second master-latch 240 (in particularly, to the input of pass gate $PG_3$).

The other tristate inverter $I_8$ of the multiplexer 210 includes an input coupled to the data input port din_k. The tristate inverter $I_8$ is enabled and disabled based on complementary shift signals ishift/$\overline{ishift}$ (e.g., enabled if ishift=0 and $\overline{ishift}$=1, and disabled if ishift=1 and $\overline{ishift}$=0). The output of the tristate inverter $I_8$ is also coupled to the input of the second master-latch 240 (in particularly, to the input of the third pass gate $PG_3$).

The pass gate $PG_3$ of the second master-latch 240 is enabled and disabled based on complementary clock signals clk/$\overline{clk}$ (e.g., enabled if clk=0 and $\overline{clk}$=1, and disabled if clk=1 and $\overline{clk}$=0). The output of the pass gate $PG_3$ is coupled to input and output of inverters $I_9$ and $I_{10}$ of the second master-latch 240, respectively, and a second input of NOR-gate $NG_2$ of the data write circuit 260. The inverters $I_9$ and $I_{10}$ (operating as the latch mechanism of the second master-latch 240) are enabled and disabled based on complementary clock signals clk/$\overline{clk}$ (e.g., enabled if clk=1 and $\overline{clk}$=0, and disabled if clk=0 and $\overline{clk}$=1). The output of the second master-latch 240 (at the input and output of inverters $I_{10}$ and $I_9$, respectively) is coupled to an input of the second slave-latch 250 (in particularly, to an input of the pass gate $PG_4$) and a second input of NOR-gate $NG_1$ of the data write circuit 260.

The pass gate $PG_4$ of the second slave-latch 250 is enabled and disabled based on complementary clock signals clk/$\overline{clk}$ (e.g., enabled if clk=1 and $\overline{clk}$=0, and disabled if clk=0 and $\overline{clk}$=1). The output of the pass gate $PG_4$ is coupled to input and output of the inverters $I_{11}$ and $I_{12}$ (operating as the latch mechanism of the second slave-latch 250), respectively. The inverters $I_{11}$ and $I_{12}$ are enabled and disabled based on complementary clock signals clk/$\overline{clk}$ (e.g., enabled if clk=0 and $\overline{clk}$=1, and disabled if clk=1 and $\overline{clk}$=0).

The output of the second slave-latch 250 (at the input and output of inverters $I_{11}$ and $I_{12}$, respectively) is coupled to the scan output port sou_k of the bit line driver 200. The scan output port sou_k is coupled to the scan input port sin_k+1 of the $k^{th}$+1 bitline driver if it is not bitline driver n or to an external output port if it is bitline driver n.

With regard to the data write circuit 260, the outputs of the NOR-gates $NG_1$ and $NG_2$ are coupled to inputs of inverters $I_{13}$ and $I_{14}$, respectively. The outputs of the inverters $I_{13}$ and $I_{14}$ are coupled to inputs of pass gates $PG_5$ and $PG_6$, respectively. The pass gates $PG_5$ and $PG_6$ may be controlled by complementary bitline select signals wm/$\overline{wm}$. The pass gates $PG_5$ and $PG_6$ are enabled if the wm/$\overline{wm}$ signals are high/low, and disabled if the wm/$\overline{wm}$ signals are low/high. The outputs of the pass gates $PG_5$ and $PG_6$ are coupled to the complementary bitlines BL_k/$\overline{BL\_k}$, respectively.

The following describes the writing of data to (as well as masking the writing of data from) a memory cell coupled to the complementary bitlines BL_k/$\overline{BL\_k}$ in functional mode (e.g., non-test mode). In functional mode, the complementary shift signals ishift/$\overline{ishift}$ are logic zero (0) and logic one (1), respectively. Accordingly, the inverters and $I_7$ are disabled or tristated. In functional mode, the slave-latches 230 and 250 and inverter $I_7$ serve no function. Additionally, in functional mode, the tristated inverters $I_2$ and $I_8$ are enabled.

To distinguish signals from ports, signals will be represented with an italicized font and corresponding ports with non-italicized font. Further, signals may be inverted and reinverted as they are processed by the bitline driver 200, but are, nonetheless, the same signals whether they are in the inverted domain or non-inverted domain.

During a first half clock cycle when the complementary clock signals clk/$\overline{clk}$ are low/high, the write mask signal wbt_k is routed from the write mask port wbt_k to the input of inverter $I_3$ by the tristate inverter $I_2$ and the pass gate $PG_1$. Also, during the first half clock cycle, the input data signal din_k is routed from the data input port din_k to the input of the inverter $I_9$ and the second input of the NOR-gate $NG_2$ by the tristate inverter $I_8$ and the pass gate $PG_3$.

During a second half clock cycle when the complementary clock signals clk/$\overline{clk}$ are high/low, the pass gates $PG_1$ and $PG_3$ are disabled to prevent any signal or noise on the ports wbt_k and data din_k from affecting the latching of the write mask signal wbt_k and the data signal din_k by the enabled inverters $I_3/I_4$ and $I_9/I_{10}$, respectively. During the second half clock cycle, the first master-latch 220 latches the write mask signal wbt_k, and the second master-latch 240 latches the data signal din_k.

The latched write mask signal wbt_k is applied to the respective first inputs of the NOR-gates $NG_1$ and $NG_2$ of the data write circuit 260. The unlatched and inverted data signal data signal din_k is applied to the second input of the NOR-gate $NG_1$, and the latched and non-inverted data signal din_k is applied to the second input of the NOR-gate $NG_2$.

If the write mask signal wbt_k is asserted (e.g., at a logic one (1)) to mask the writing of data into a memory cell (C), the NOR-gates $NG_1$ and $NG_2$ output logic low states. In response, the inverters $I_{13}$ and $I_{14}$ generate logic high states. The logic high states are produced on the complementary bitlines BL_k/$\overline{BL\_k}$ via the pass gates $PG_5$ and $PG_6$, which are enabled via the bitline select signals wm/$\overline{wm}$ during a write operation. The logic high states on the complementary bitlines BL_k/$\overline{BL\_k}$ prevent the changing of data stored by the memory cell (C) enabled by the asserted wordline.

If the write mask signal wbt_k is deasserted (e.g., at a logic zero (0)) so as not to mask the writing of data into a target memory cell (C), the NOR-gates $NG_1$ and $NG_2$ output the inverted and non-inverted data signal din_k. In response, the inverters $I_{13}$ and $I_{14}$ output the non-inverted and inverted data signal din_k. The non-inverted and inverted data signal din_k is applied to complementary bitlines BL_k/$\overline{BL\_k}$ via the pass gates $PG_5$ and $PG_6$, respectively. Accordingly, data based on the data signal din_k is written into the target memory cell (C) enabled by the asserted wordline.

The following describes a method of testing an operation of the bitline driver 200. The testing of an operation of the bitline driver 200 may begin in scan shift mode whereby a test vector signal is shifted into the bitline driver 200. In scan shift mode, the complementary shift signals ishift/$\overline{ishift}$ signal are high/low. Accordingly, the tristate inverters $I_1$ an $I_7$ are enabled, and the tristate inverters $I_2$ and $I_8$ are disabled. Thus, a scan path exists from the scan input port sin_k to the scan output port sou_k via the first master-latch 220, first slave-latch 230, inverter $I_7$, second master latch 240, and second slave-latch 250.

During a first half clock cycle when the complementary clock signals clk/$\overline{clk}$ are low/high, the test vector signal sin_k is routed from the scan input port sin_k to the input of the inverter $I_3$ by the tristate inverter $I_1$ and pass gate $PG_1$. During a second half clock cycle when the complementary clock signals clk/$\overline{clk}$ are high/low, the first master-latch 220 latches the test vector signal sin_k. Also, during the second half clock cycle, the pass gate $PG_2$ passes the latched test vector signal sin_k to the input of the inverter $I_5$ of the first slave-latch 250.

During a third half clock cycle when the complementary clock signals clk/$\overline{clk}$ are low/high, the first slave-latch 230 latches the test vector signal sin_k. Also, during the third half clock cycle, the pass gate $PG_3$ passes the latched test vector signal sin_k to the input of the inverter $I_9$ of the second master-latch 240. During a fourth half clock cycle when the complementary clock signals clk/$\overline{clk}$ are high/low, the second master-latch 240 latches the test vector signal sin_k. Also, during the fourth half clock cycle, the pass gate $PG_4$ passes the latched test vector signal sin_k to the input of the second slave-latch 250.

During a fifth half clock cycle when the complementary clock signals clk/$\overline{clk}$ are low/high, the second slave-latch 250 latches the test vector signal sin_k to produce it at the scan output port sou_k. Once the test vector signal has been scanned into all of the bitline drivers 0 to n, the bitline driver 200 is operated in scan capture mode where the clock signal clk is generated at a frequency in accordance with the prescribed test operation performed on the bitline driver 200. The captured test vector signal is then generated at the outputs of the master-latches 220 and 240. Then, the bitline driver 200 is operated again in a scan shift mode to scan out the captured test vector signal.

Thus, as described above, it takes 2.5 clock cycles for the test vector signal sin_k to propagate through the bit line driver 200. Additionally, the bit line driver 200 includes four (4) latches 220, 230, 240, and 250. For faster test operation, it would be desirable to reduce the number of clock cycles for the test vector signal sin_k to propagate through the bitline driver 200. Further, to reduce the integrated circuit area and power consumption, it would be desirable to reduce the number of latches required for the bitline driver 200.

Figure 3:
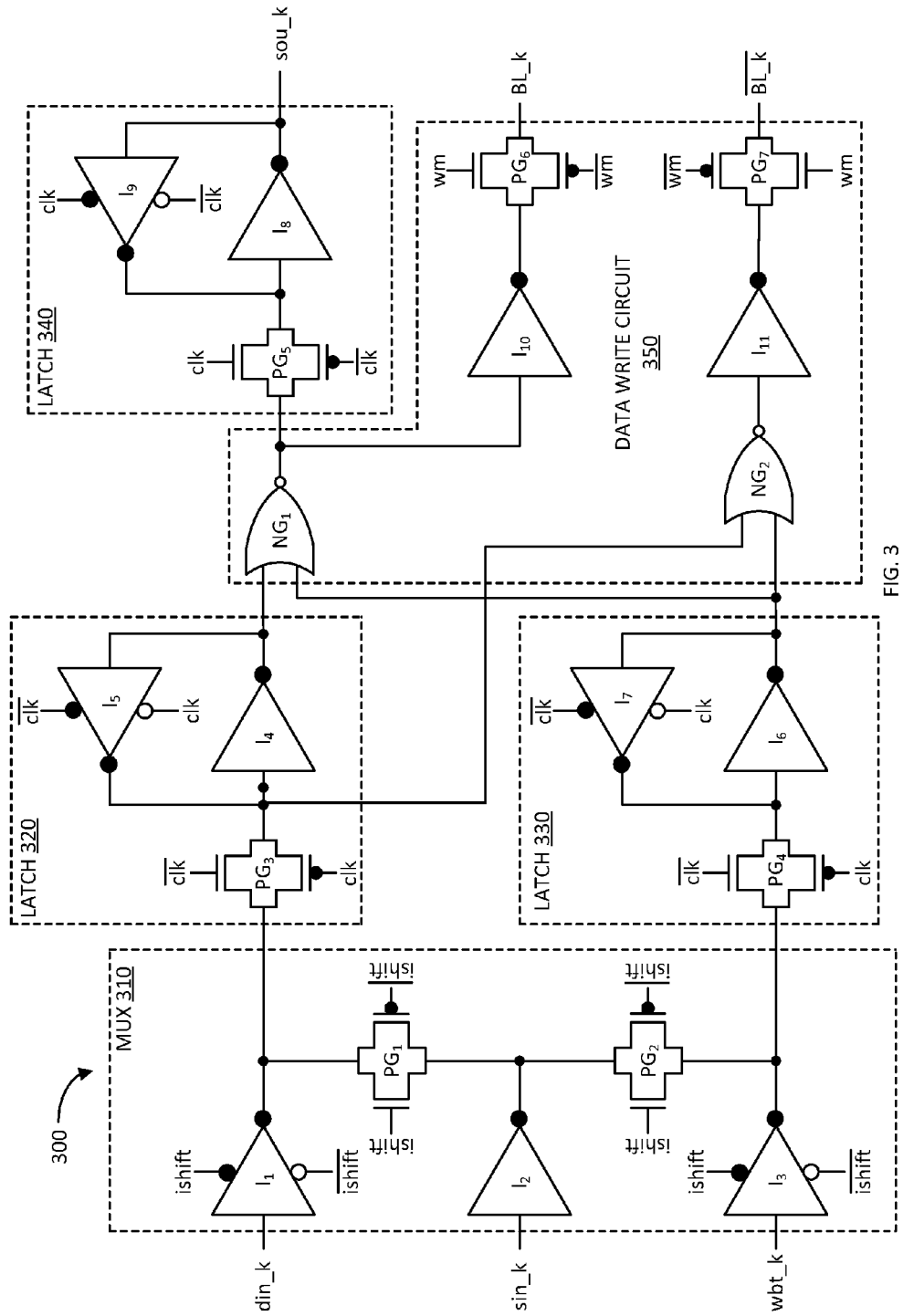
FIG. 3 illustrates a schematic diagram of another exemplary bitline driver in accordance with another aspect of the disclosure.

FIG. 3 illustrates a schematic diagram of another exemplary bitline driver 300 in accordance with an aspect of the disclosure. The bitline driver 300 may be an example of one of the bitline drivers 0 to n of memory circuit 100 previously discussed. For instance, the bitline drive 300 may be the $k^{th}$ bitline driver of the bitline drivers 0 to n.

In summary, the scan path of bitline driver 300 is split into two parallel paths: a first path through a latch for the input data signal din_k, and a second path through a latch for the write mask signal wbt_k. A NOR-gate of a data write circuit merges the two parallel scan paths into one, and then the merged scan path proceeds to a scan output latch.

In this configuration, the propagating of the test vector signal sin_k through the bitline driver 300 only requires 1.5 clock cycles, which is much faster than the 2.5 clock cycles required by bitline driver 200. Additionally, the bitline driver 300 is implemented with three (3) latches instead of four (4) latches as required by the bitline driver 200. This translates into substantial savings in IC area and power consumption, as there may be a large number of bitline drivers in a memory circuit.

In particular, the bitline driver 300 includes a multiplexer 310 including tristate inverters and $I_3$, inverter $I_2$, and pass gates $PG_1$ and $PG_2$; a first latch 320 including a pass gate $PG_3$, inverter $I_4$ and tristate inverter $I_5$; a second latch 330 including a pass gate $PG_4$, inverter $I_6$ and tristate inverter $I_7$; and a third latch 340 including a pass gate $PG_5$, inverter $I_8$ and tristate inverter $I_9$. The bitline driver 300 further a data write circuit 350 including first and second NOR-gates $NG_1$ and $NG_2$, inverters $I_{10}$ and $I_{11}$, and pass gates $PG_6$ and $PG_7$. The pass gates $PG_6$ and $PG_7$ are coupled to complementary bitlines BL_k/$\overline{BL\_k}$, respectively. A column of memory cells including a corresponding precharge circuit (both not shown) are coupled to the complementary BL_k/$\overline{BL\_k}$, as previously discussed with reference to FIG. 1B.

The tristate inverter $I_1$ includes an input coupled to an input data port din_k for receiving a data signal din_k. The tristate inverter $I_1$ is enabled and disabled based on complementary shift signals ishift/$\overline{ishift}$ (e.g., enabled if ishift=0 and $\overline{ishift}$=1, and disabled if ishift=1 and $\overline{ishift}$=0). The output of the tristate inverter $I_1$ is coupled to an input of the first latch 320 (in particularly, to an input of the pass gate $PG_3$).

The inverter $I_2$ includes an input coupled to the scan input port sin_k for receiving a test vector signal sin_k. The scan input port sin_k is coupled to the scan output port sou_k-1 of the $k^{th}$-1 bitline driver if it is not bitline driver 0 or to an external input port if it is bitline driver 0. The output of the inverter $I_2$ is coupled to respective inputs of the pass gates $PG_1$ and $PG_2$.

The tristate inverter $I_3$ includes an input coupled to a write mask port wbt_k for receiving a write mask signal wbt_k. The tristate inverter $I_3$ is enabled and disabled based on complementary shift signals ishift/$\overline{ishift}$ (e.g., enabled if ishift=0 and $\overline{ishift}$=1, and disabled if ishift=1 and $\overline{ishift}$=0). The output of the tristate inverter $I_3$ is coupled to an input of the second latch 330 (in particular, to an input the pass gate $PG_4$).

The pass gates $PG_1$ and $PG_2$ are enabled and disabled based on the complementary shift signals shift/$\overline{ishift}$ (e.g., enabled if ishift=1 and $\overline{ishift}$=0, and disabled if ishift=0 and $\overline{ishift}$=1). The output of the pass gate $PG_1$ is coupled to the input of the first latch 320 (in particularly, to the input of the pass gate $PG_3$), and the output of the pass gate $PG_2$ is coupled to the input of the second latch 330 (in particularly, to the input of the pass gate $PG_4$).

The pass gates $PG_3$ and $PG_4$ are enabled and disabled based on the complementary clock signals clk/$\overline{clk}$ (e.g., enabled if clk=0 and $\overline{clk}$=1, and disabled if clk=1 and $\overline{clk}$=0). The output of the pass gate $PG_3$ of the first latch 320 is coupled to the input and output of inverters $I_4$ and $I_5$, respectively, and to a first input of NOR-gate $NG_2$ of the data write circuit 350. The output of the pass gate $PG_4$ of the second latch 330 is coupled to the input and output of inverters $I_6$ and $I_7$, respectively.

The first latch 320 is enabled and disabled based on complementary clock signals clk/$\overline{clk}$ (e.g., enabled if clk=1 and $\overline{clk}$=0, and disabled if clk=0 and $\overline{clk}$=1). The output of the first latch 320 (at the input and output of inverters $I_4$ and $I_3$, respectively) is coupled to a first input of the NOR-gate $NG_1$ of the data write circuit 350.

The second latch 330 is enabled and disabled based on complementary clock signals clk/$\overline{clk}$ (e.g., enabled if clk=1 and $\overline{clk}$=0, and disabled if clk=0 and $\overline{clk}$=1). The output of the second latch 330 (at the input and output of inverters $I_7$ and $I_6$, respectively) is coupled to respective second inputs of the NOR-gates $NG_1$ and $NG_2$ of the data write circuit 350.

With regard to the data write circuit 350, the outputs of the NOR-gates $NG_1$ and $NG_2$ are coupled to inputs of inverters $I_{10}$ and $I_{11}$, respectively. The outputs of the inverters $I_{10}$ and $I_{11}$ are coupled to inputs of pass gates $PG_6$ and $PG_7$, respectively. The pass gates $PG_6$ and $PG_7$ are controlled by complementary bitline select signals wm/$\overline{wm}$. The pass gates $PG_6$ and $PG_7$ are enabled if the signals wm/$\overline{wm}$ signal are high/low, and disabled if the signals wm/$\overline{wm}$ signal are low/high. The outputs of the pass gates $PG_6$ and $PG_7$ are coupled to the complementary bitlines BL_k/$\overline{BL\_k}$, respectively.

The output of the first NOR-gate $NG_1$ of the data write circuit 350 is coupled to an input of the third latch 340 (in particularly, to an input of the pass gate $PG_5$). The pass gates $PG_5$ is enabled and disabled based on the complementary clock signals clk/$\overline{clk}$ (e.g., enabled if clk=1 and $\overline{clk}$=0, and disabled if clk=0 and $\overline{clk}$=1). The output of the pass gate $PG_5$ is coupled to the input and output of inverters $I_8$ and $I_9$, respectively. The output of the third latch 340 (at the input and output of inverters $I_9$ and $I_8$, respectively) is coupled to the scan output port sou_k of the bitline driver 300. The scan output port sou_k is coupled to the scan input sin_k+1 of the $k^{th}$+1 bitline driver if it is not bitline driver n or to an external output port if it is bitline driver n.

The following describes the writing of data to (as well as masking the writing of data from) a memory cell (C) coupled to complementary bitline BL_k/$\overline{BL\_k}$ in functional mode. In functional mode, the complementary shift signals ishift/$\overline{ishift}$ are logic zero (0) and one (1), respectively. Accordingly, the pass gates $PG_1$ and $PG_2$ are disabled or tristated. In functional mode, the third latch 340 serves no function. Additionally, in functional mode, the tristated inverters $I_1$ and $I_3$ are enabled.

During a first half clock cycle when the complementary clock signals clk/$\overline{clk}$ are low/high, the data signal din_k is routed from the data input port din_k to the input of the inverter $I_4$ and the first input of the NOR-gate $NG_2$ by the inverter $I_1$ and pass gate $PG_3$. Also, during the first half clock cycle, the write mask signal wbt_k is routed from the write mask port wbt_k to the input of the inverter $I_6$ by the tristate inverter $I_3$ and pass gate $PG_4$.

During a second half clock cycle when the complementary clock signals clk/$\overline{clk}$ is high/low, the pass gates $PG_3$ and $PG_4$ are disabled to prevent signal and/or noise at the ports din_k and wbt_k from affecting the latching of the data signal din_k and write mask signal wbt_k by the first and second latches 320 and 330, respectively. Also, during the second half clock cycle, the first latch 320 latches the data signal din_k, and the second latch 230 latches the write mask signal wbt_k.

The latched write mask signal wbt_k is applied to the respective second inputs of the NOR-gates $NG_1$ and $NG_2$ of the data write circuit 350. The unlatched and inverted data signal data signal din_k is applied to the first input of the NOR-gate $NG_2$, and the latched and non-inverted data signal din_k is applied to the first input of the NOR-gate $NG_1$.

If the write mask signal wbt_k is asserted (e.g., at a logic one (1)) to mask the writing of data into a memory cell (C), the NOR-gates $NG_1$ and $NG_2$ output logic low states. In response, the inverters $I_{13}$ and $I_{14}$ generate logic high states. The logic high states are produced on the complementary bitlines BL_k/$\overline{BL\_k}$ via the pass gates $PG_6$ and $PG_7$, which are enabled via the bitline select signals wm/$\overline{wm}$ during a write operation. The logic high states on the complementary bitlines BL_k/$\overline{BL\_k}$ prevent the changing of data stored by the memory cell (C) enabled by the asserted wordline.

If the write mask signal wbt_k is deasserted (e.g., at a logic zero (0)) so as not to mask the writing of data into a target memory cell (C), the NOR-gates $NG_1$ and $NG_2$ output the inverted and non-inverted data signal din_k. In response, the inverters $I_{13}$ and $I_{14}$ output the non-inverted and inverted data signal din_k. The non-inverted and inverted data signal din_k are applied to complementary bitlines BL_k/$\overline{BL\_k}$ via the pass gates $PG_6$ and $PG_7$, respectively. Accordingly, data based on the data signal din_k is written into the target memory cell (C) enabled by the asserted wordline.

The following describes the shifting in of a test vector signal for testing the operation of the bit line driver 300. In scan shift mode, the complementary shift signals ishift/$\overline{ishift}$ are high/low, respectively. Accordingly, the pass gates $PG_1$ and $PG_2$ are enabled, and the tristate inverters $I_1$ and $I_3$ are disabled or tristated. Thus, two parallel scan paths exist from the scan input port sin_k to the scan output sou_k: The first path traverses pass gate $PG_1$ and first latch 320; the second path traverses pass gate $PG_2$ and the second latch 330. The NOR-gate $NG_1$ merges the parallel scan paths into a single path, and continues to the scan output port sou_k via the third latch 340.

During a first half clock cycle when the complementary clock signals clk/$\overline{clk}$ are low/high, a test vector signal sin_k is routed from the scan input port sin_k to the input of the inverter $I_4$ of the first latch 320 by the pass gates $PG_1$ and $PG_3$. Also, during this first half clock cycle, the test vector signal sin_k is also routed from the scan input port sin_k to the input of the inverter $I_6$ of the second latch 330 by the pass gates $PG_2$ and $PG_4$. During a second half clock cycle when the complementary clock signals clk/$\overline{clk}$ are high/low, the first and second latches 320 and 330 latch the test vector signal sin_k.

Accordingly, the NOR-gate $NG_1$ outputs the test vector signal sin_k (albeit, inverted). Also, during the second half clock cycle, the pass gate $PG_5$ passes the inverted test vector signal sin_k to the input of inverter $I_8$ of the third latch 340. During the third half clock cycle when the complementary clock signals clk/$\overline{clk}$ are low/high, the third latch 340 latches the test vector signal sin_k to produce it at the scan output port sou_k.

Thus, as described above, it takes 1.5 clock cycles for the test vector signal sin_k to propagate through the bitline driver 300, instead of 2.5 clock cycles required by the bitline driver 200. Thus, the bitline driver 300 is able to propagate a test vector signal much faster than bitline driver 200. Additionally, the bitline driver 300 has only three (3) latches, whereas bitline driver 200 has four (4) latches. This translates to substantial savings in IC area and power consumption as the IC may include many bitline drivers depending on the size of the corresponding memory array.

Figure 4:
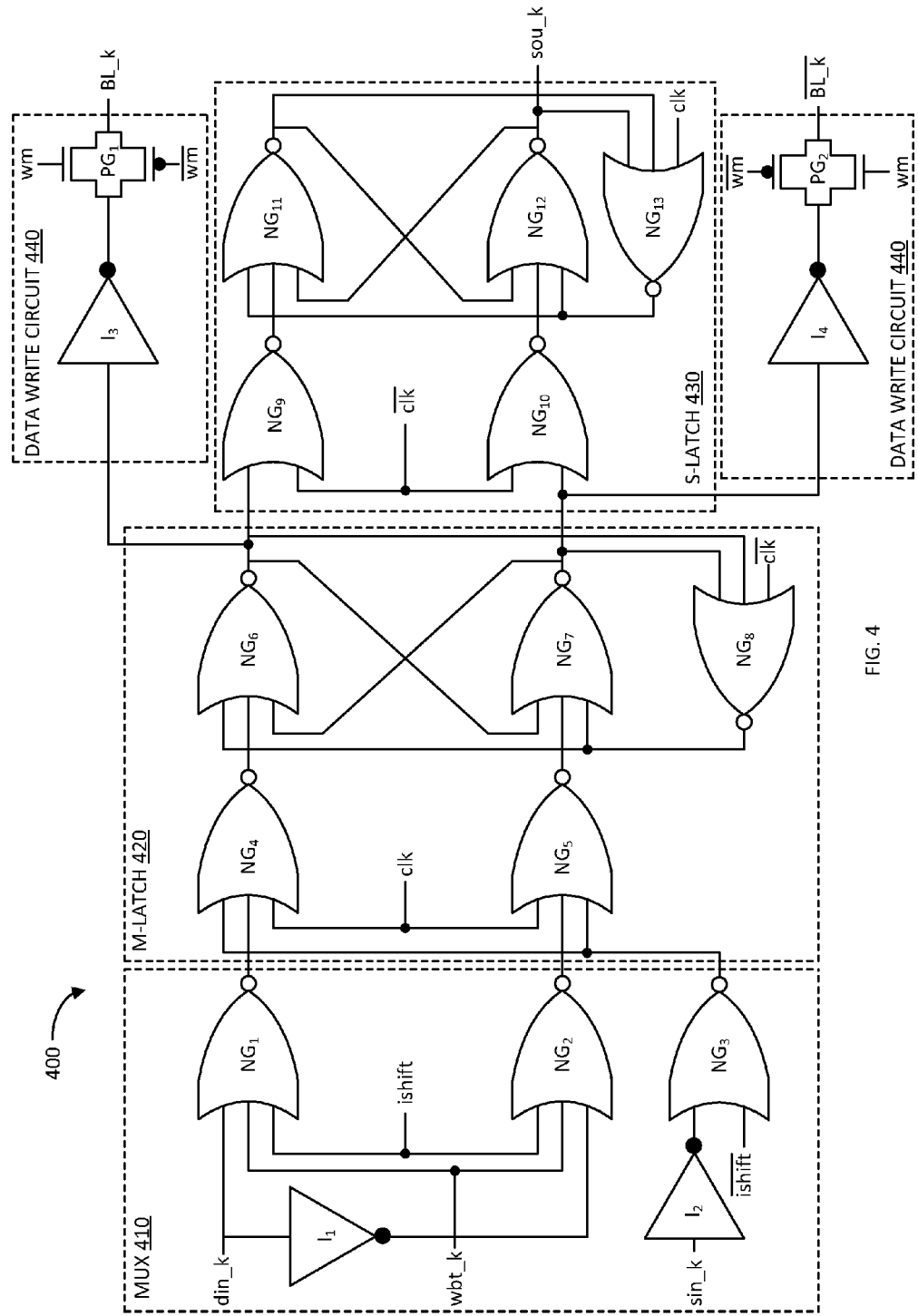
FIG. 4 illustrates a schematic diagram of another exemplary bitline driver in accordance with another aspect of the disclosure.

FIG. 4 illustrates a schematic diagram of another exemplary bitline driver 400 in accordance with another aspect of the disclosure. The bitline driver 400 may be an example of one of the bitline drivers 0 to n of memory circuit 100 previously discussed. For instance, the bitline drive 400 may be the $k^{th}$ bitline driver of the bitline drivers 0 to n.

In particular, the bitline driver 400 includes a multiplexer 410 (generally, a gating device or circuit) including inverters $I_1$ and $I_2$, and NOR-gates $NG_1$, $NG_2$, and $NG_3$; a master-latch 420 including $NG_4$, $NG_5$, $NG_6$, $NG_7$, and $NG_8$; a slave-latch 430 including NOR-gates $NG_9$, $NG_{10}$, $NG_{11}$, $NG_{12}$, and $NG_{13}$; and a data write circuit 440 including inverters $I_3$ and $I_4$, pass gates $PG_1$ and $PG_2$.

The NOR-gates $NG_1$, $NG_2$, $NG_4$, $NG_5$, $NG_6$, $NG_7$, $NG_8$, $NG_{11}$, $NG_{12}$, and $NG_{13}$ are three-input NOR-gates, and the NOR-gates $NG_3$, $NG_9$, and $NG_{10}$ are two-input NOR-gates. For description purposes, the inputs of each NOR-gate are referred to below in consecutive order beginning with "first input" for the upper input, "second input" for the middle input of a three-input NOR-gate and lower input of a two-input NOR-gate, and "third input" for the lower input of a three-input NOR-gate.

The data input port din_k is coupled to an input of the inverter $I_1$ and a first input of NOR-gate $NG_1$. The output of the inverter $I_1$ is coupled to a third input of NOR-gate $NG_2$. The write mask port wbt_k is coupled to the respective second inputs of NOR-gates $NG_1$ and $NG_2$. The scan shift signal ishift is applied to first and third inputs of NOR-gates $NG_1$ and $NG_2$, respectively. The scan input port sin_k is coupled to an input of the inverter $I_2$. The output of the inverter $I_2$ is coupled to a first input of the NOR-gate $NG_3$. The complementary shift signal $\overline{\text{ishift}}$ is applied to a second input of the NOR-gate $NG_3$.

The output of the NOR-gate $NG_1$ is coupled to a second input of the NOR-gate $NG_4$. The output of the NOR-gate $NG_2$ is coupled to a second input of the NOR-gate $NG_5$. The output of the NOR-gate $NG_3$ is coupled to first and third inputs of NOR-gates $NG_4$ and $NG_5$, respectively. The clock signal clk is applied to the third and first inputs of NOR-gates $NG_4$ and $NG_5$, respectively.

The NOR-gates $NG_6$ and $NG_7$ are cross-coupled. That is, the output of NOR-gate $NG_6$ is coupled to a first input of NOR-gate $NG_7$, and the output of NOR-gate $NG_7$ is coupled to a third input of NOR-gate $NG_6$. The output of NOR-gate $NG_4$ is coupled to a second input of NOR-gate $NG_6$. The output of NOR-gate $NG_5$ is coupled to a second input of NOR-gate $NG_7$. The outputs of NOR-gates $NG_6$ and $NG_7$ are coupled to second and first inputs of NOR-gate $NG_8$, respectively. The complementary clock signal $\overline{\text{clk}}$ is applied to a third input of NOR-gate $NG_8$. The output of NOR-gate $NG_8$ is coupled to first and third inputs of NOR-gates $NG_6$ and $NG_7$, respectively.

The output of NOR-gate $NG_6$ is also coupled to a first input of NOR-gate $NG_9$ and to an input of inverter $I_3$. The output of NOR-gate $NG_7$ is coupled to a second input of NOR-gate $NG_{10}$ and to an input of inverter $I_4$. The complementary clock signal $\overline{\text{clk}}$ is applied to second and first inputs of NOR-gates $NG_9$ and $NG_{10}$, respectively.

The NOR-gates $NG_{11}$ and $NG_{12}$ are cross-coupled. That is, the output of NOR-gate $NG_{11}$ is coupled to a first input of NOR-gate $NG_{12}$, and the output of NOR-gate $NG_{12}$ is coupled to a third input of NOR-gate $NG_{11}$. The output of NOR-gate $NG_9$ is coupled to a second input of NOR-gate $NG_{11}$. The output of NOR-gate $NG_{10}$ is coupled to a second input of NOR-gate $NG_{12}$. The outputs of NOR-gates $NG_{11}$ and $NG_{12}$ are coupled to second and first inputs of NOR-gate $NG_{13}$, respectively. The clock signal clk is applied to a third input of NOR-gate $NG_{13}$. The output of NOR-gate $NG_{13}$ is coupled to first and third inputs of NOR-gates $NG_{11}$ and $NG_{12}$, respectively. The scan output port sou_k for the bitline driver 300 is coupled to the output of the NOR-gate $NG_{12}$.

The outputs of the inverters $I_3$ and $I_4$ are coupled to inputs of pass gates $PG_1$ and $PG_2$, respectively. The outputs of the pass gates $PG_1$ and $PG_2$ are coupled to the complementary bitlines BL_k/$\overline{\text{BL\_k}}$, respectively. A column of memory cells including a corresponding precharge circuit (both not shown) are coupled to the complementary BL_k/$\overline{\text{BL\_k}}$, as previously discussed with reference to FIG. 1B.

The following describes the writing of data to (as well as masking the writing of data from) a memory cell (C) coupled to complementary bitline BL_k/$\overline{\text{BL\_k}}$ in functional mode. In functional mode, the complementary shift signals ishift/$\overline{\text{ishift}}$ are logic zero (0) and one (1), respectively. Also, in functional mode, the slave-latch 430 does not serve a function.

In this example, the write mask signal wbt_k is deasserted (e.g., at a logic zero (0)) so as not to mask the writing of data into the target memory cell (C). If the write mask signal wbt_k were asserted (e.g., at a logic one (1)), the master-latch 420 latches two logic low signals at the outputs of NOR-gates $NG_6$ and $NG_7$. In response, the inverters $I_3$ and $I_4$ produce logic high signals on the complementary bitlines BL_k/$\overline{\text{BL\_k}}$ via the pass gates $PG_1$ and $PG_2$ enabled by the complementary bitline select signals wm/$\overline{\text{wm}}$. The logic high signals on the bitlines BL_k/$\overline{\text{BL\_k}}$ prevent the writing of data to a memory cell selected by a corresponding asserted wordline.

With the ishift and write mask signals being deasserted, the multiplexer 410 outputs the data signal din_k. That is, the ishift and write mask signals being logic zeros (Os) and being applied to two inputs of the three-input NOR-gates $NG_1$ and $NG_2$ essentially enable the gates to output inverted and non-inverted data signal din_k, respectively. Further, the complementary shift signal $\overline{\text{ishift}}$, being a logic one (1) in functional mode, causes the NOR-gate $NG_3$ to output a logic zero (0) so as to enable the NOR-gates $NG_4$ and $NG_5$ from the scan input perspective.

During a first half clock cycle when the complementary clock signals clk/$\overline{\text{clk}}$ are low/high, the NOR-gates $NG_4$ and $NG_5$ output the non-inverted and inverted data signal din_k, respectively. Also, during the first half clock cycle, the NOR-gate $NG_8$ generates a logic zero (0) to enable the cross-coupled NOR-gates $NG_6$ and $NG_7$ to output inverted and non-inverted data signal din_k, respectively.

During a second half clock cycle when the complementary clock signals clk/$\overline{\text{clk}}$ are high/low, respectively, the clock signal clk disables the NOR-gates $NG_4$ and $NG_5$ to prevent signal and/or noise at the data input port din_k from affecting the data latched by the master-latch 420. The complementary clock signal $\overline{\text{clk}}$ causes the NOR-gate $NG_8$ to output a logic one (1) so that the cross-coupled NOR-gates $NG_6$ and $NG_7$ latch the inverted and non-inverted data signal din_k at the outputs of the NOR-gates, respectively.

In response to the latched inverted and non-inverted data signal din_k, the inverters $I_3$ and $I_4$ generate non-inverted and inverted data signal din_k, respectively. Based on the bitline select signals wm/$\overline{\text{wm}}$ being asserted (e.g., at logic high and low, respectively), the pass gates $PG_1$ and $PG_2$ pass the non-inverted and inverted data signal din_k to the complementary bitlines BL_k/$\overline{\text{BL\_k}}$, respectively. This causes the writing data into the target memory cell (C) based on the data signal din_k.

In scan shift mode, the complementary shift signals ishift/$\overline{ishift}$ are logic one (1) and logic zero (0), respectively. The signal ishift being a logic one (1) effectively disables the NOR-gates $NG_1$ and $NG_2$ so that they both output logic zeros (Os). The inverter $I_2$ generates an inverted test vector signal sin_k. The complementary signal $\overline{ishift}$ being a logic zero (0) causes the NOR-gate $NG_3$ to output the non-inverted test vector signal sin_k.

During a first half clock cycle, the complementary clock signals clk/$\overline{clk}$ are logic low and high, respectively. The clock signal clk being low causes the NOR-gates $NG_4$ and $NG_5$ to both output the inverted test vector signal sin_k. The complementary clock signal $\overline{clk}$ being high causes the NOR-gate $NG_8$ to output a logic low. This causes the cross-coupled NOR-gates $NG_6$ and $NG_7$ to output the non-inverted test vector signal sin_k.

During a second half clock cycle, the complementary clock signals clk/$\overline{clk}$ are logic high and low, respectively. The clock signal clk being high disables the NOR-gates $NG_4$ and $NG_5$ to prevent signal and/or noise at the scan input port sin_k from affecting the test vector signal sin_k latched by the master-latch 420. The complementary clock signal $\overline{clk}$ being low causes the NOR-gate $NG_8$ to output a logic one (1) so that the cross-coupled NOR-gates $NG_6$ and $NG_7$ latch the non-inverted test vector signal sin_k. The complementary clock signal $\overline{clk}$ being low also causes the NOR-gates $NG_9$ and $NG_{10}$ to output the inverted test vector signal sin_k.

During a third half clock cycle, the complementary clock signals clk/$\overline{clk}$ are logic low and high, respectively. The complementary clock signal $\overline{clk}$ being high disables the NOR-gates $NG_9$ and $NG_{10}$ to prevent the output of the master-latch 420 from affecting the data latched by the slave-latch 430. The clock signal clk being low causes the NOR-gate $NG_{13}$ to output a logic one (1) so that the cross-coupled NOR-gates $NG_{ii}$ and $NG_{12}$ latch the test vector signal sin_k and provide it to the scan output port sou_k.

Thus, as described above, it takes 1.5 clock cycles for the test vector signal sin_k to propagate through the bitline driver 400, instead of 2.5 clock cycles required by the bitline driver 200. Thus, the bitline driver 400 is able to propagate a test vector signal much faster than bitline driver 200. Additionally, the bitline driver 400 has only two (2) latches, whereas bitline driver 200 has four (4) latches. This translates to substantial savings in IC area and power consumption as the IC may include many bitline drivers depending on the size of the corresponding memory array.

Figure 5:
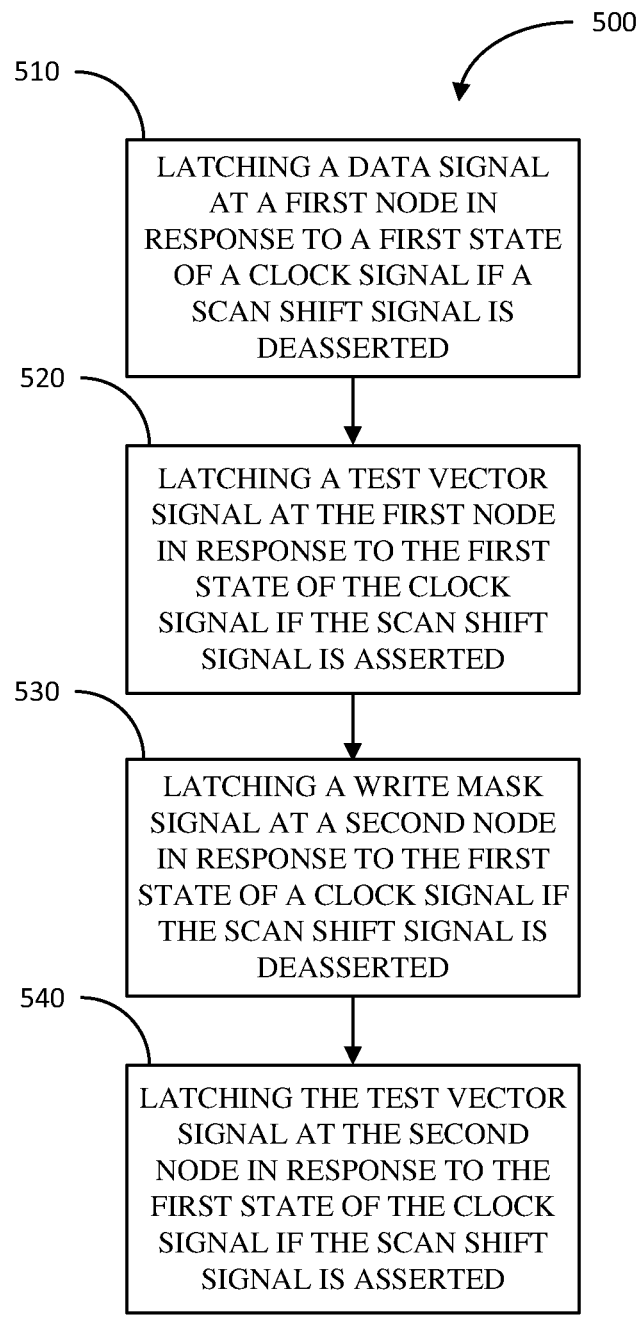
FIG. 5 illustrates a flow diagram of an exemplary method of operating a bitline driver in accordance with another aspect of the disclosure.

FIG. 5 illustrates a flow diagram of an exemplary method 500 of operating a bitline driver in accordance with another aspect of the disclosure.

The method 500 includes latching a data signal at a first node in response to a first state of a clock signal if a scan shift signal is deasserted (block 510). An example of a means for latching a data signal at a first node in response to a first state of a clock signal if a scan shift signal is deasserted includes tristate inverter $I_1$, pass gate $PG_1$, and the latch 320 of bitline driver 300.

The method 500 further includes latching a test vector signal at the first node in response to the first state of the clock signal if the scan shift signal is asserted (block 520). An example of a means for latching a test vector signal at the first node in response to the first state of the clock signal if the scan shift signal is asserted includes tristate inverter $I_1$, pass gate $PG_1$, and the latch 320 of bitline driver 300.

The method 500 further includes latching a write mask signal at a second node in response to the first state of the clock signal if the scan shift signal is deasserted (block 530). An example of a means for latching a write mask signal at a second node in response to the first state of the clock signal if the scan shift signal is deasserted includes tristate inverter $I_3$, pass gate $PG_2$, and the latch 330 of bitline driver 300.

The method 500 further includes latching the test vector signal at the second node in response to the first state of the clock signal if the scan shift signal is asserted (block 540). An example of a means for latching the test vector signal at the second node in response to the first state of the clock signal if the scan shift signal is asserted includes tristate inverter $I_3$, pass gate $PG_2$, and the latch 330 of bitline driver 300.

Figure 6:
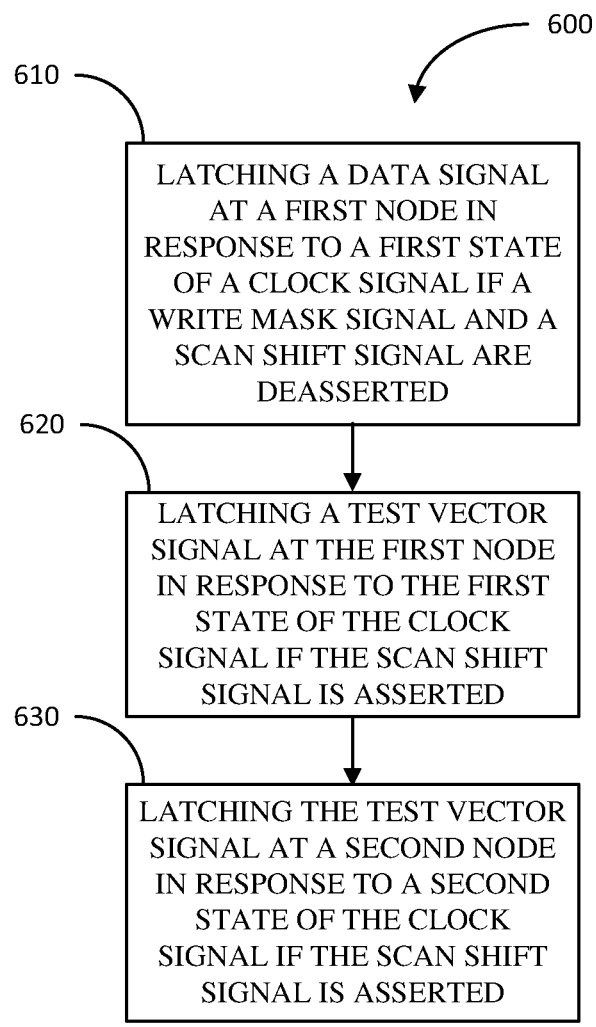
FIG. 6 illustrates a flow diagram of another exemplary method of operating a bitline driver in accordance with another aspect of the disclosure.

FIG. 6 illustrates a flow diagram of an exemplary method 600 of operating a bitline driver in accordance with another aspect of the disclosure.

The method 600 includes latching a data signal at a first node in response to a first state of a clock signal if a write mask signal and a scan shift signal are deasserted (block 610). An example of a means for latching a data signal at a first node in response to a first state of a clock signal if a write mask signal and a scan shift signal are deasserted includes the master-latch 420 of bitline driver 400.

The method 600 further includes latching a test vector signal at the first node in response to the first state of the clock signal if the scan shift signal is asserted (block 620). An example of a means for latching a test vector signal at the first node in response to the first state of the clock signal if the scan shift signal is asserted includes the master-latch 420 of bitline driver 400.

The method 600 further includes latching the test vector signal at a second node in response to a second state of the clock signal if the scan shift signal is asserted (block 630). An example of a means for latching the test vector signal at a second node in response to a second state of the clock signal if the scan shift signal is asserted includes the slave-latch 430 of bitline driver 400.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. An apparatus, comprising:
   a first latch configured to:
      latch a data signal in response to a first state of a clock signal if a scan shift signal is deasserted; and
      latch a test vector signal in response to the first state of the clock signal if the scan shift signal is asserted; and
   a second latch configured to:
      latch a write mask signal in response to the first state of the clock signal if the scan shift signal is deasserted; and
      latch the test vector signal in response to the first state of the clock signal if the scan shift signal is asserted.

2. The apparatus of claim 1, further comprising a gating circuit configured to:
   route the test vector signal from a scan input port to the first and second latches in response to the scan shift signal being asserted; and prevent the routing of the test vector signal from the scan input port to the first and second latches in response to the scan shift signal being deasserted.

3. The apparatus of claim 2, wherein the gating circuit comprises:
a first pass gate coupled between the scan input port and the first latch, wherein the first pass gate turns on in response to the scan shift signal being asserted, and turns off in response to the scan shift signal being deasserted; and
a second pass gate coupled between the scan input port and the second latch, wherein the second pass gate turns on in response to the scan shift signal being asserted, and turns off in response to the scan shift signal being deasserted.

4. The apparatus of claim 1, further comprising a gating device coupled between a data input port for receiving the data signal and an input of the first latch, wherein the gating device is configured to:
generate the data signal at an output of the gating device in response to the scan shift signal being deasserted; and
tristate the output in response to the scan shift signal being asserted.

5. The apparatus of claim 1, further comprising a gating device coupled between a write mask input port for receiving the write mask signal and an input of the second latch, wherein the gating device is configured to:
generate the write mask signal at an output of the gating device in response to the scan shift signal being deasserted; and
tristate the output in response to the scan shift signal being asserted.

6. The apparatus of claim 1, wherein the first latch comprises:
a first inverter;
a pass gate configured to:
pass the data signal or the test vector signal from an input of the pass gate to the first inverter in response to a second state of the clock signal;
decouple the input from the first inverter in response to the first state of the clock signal;
a second inverter configured to:
be cross-coupled with the first inverter to latch the data signal or the test vector signal in response to the first state of the clock signal; and
not be cross-coupled with the first inverter in response to the second state of the clock signal.

7. The apparatus of claim 1, wherein the second latch comprises:
a first inverter; and
a pass gate configured to:
pass the write mask signal or the test vector signal from an input of the pass gate to the first inverter in response to a second state of the clock signal;
decouple the input from the first inverter in response to the first state of the clock signal;
a second inverter configured to:
be cross-coupled with the first inverter to latch the write mask signal or the test vector signal in response to the first state of the clock signal; and
not be cross-coupled with the first inverter in response to the second state of the clock signal.

8. The apparatus of claim 1, further comprising a third latch configured to latch the test vector signal in response to a second state of the clock signal if the scan shift signal is asserted, wherein the latched test vector signal is produced at a scan output port.

9. The apparatus of claim 1, wherein the third latch comprises:
a first inverter;
a pass gate configured to:
pass the test vector signal from an input of the pass gate to the first inverter in response to the first state of the clock signal;
decouple the input from the first inverter in response to the second state of the clock signal;
a second inverter configured to:
be cross-coupled with the first inverter to latch the test vector signal in response to the second state of the clock signal; and
not be cross-coupled with the first inverter in response to the first state of the clock signal.

10. The apparatus of claim 1, further comprising a data write circuit configured to write data to a memory cell coupled to complementary bitlines based on the data signal if the write mask signal is deasserted.

11. The apparatus of claim 10, wherein the data write circuit comprises:
a first OR-gate or first NOR-gate including a first input configured to receive the latched data signal from the first latch, a second input configured to receive the latched write mask signal from the second latch, and an output coupled to one of the complementary bitlines; and
a second OR-gate or second NOR-gate including a first input configured to receive the data signal from the first latch, a second input configured to receive the latched write mask signal from the second latch, and an output coupled to the other of the complementary bitlines.

12. The apparatus of claim 11, wherein the data write circuit comprises:
a first pass gate configured to route the data signal from the first OR-gate or the first NOR-gate to the one of the complementary bitlines in response to an asserted state of a bitline select signal; and
a second pass gate configured to route the data signal from the second OR-gate or the second NOR-gate to the other of the complementary bitlines in response to the asserted state of the bitline select signal.

13. The apparatus of claim 11, further comprising a third latch configured to latch the test vector signal in response to a second state of the clock signal if the scan shift signal is asserted, wherein the latched test vector signal is produced at a scan output port, and wherein the first OR-gate or first NOR-gate is coupled between the first latch and the third latch.

14. A method, comprising:
latching a data signal at a first node in response to a first state of a clock signal if a scan shift signal is deasserted;
latching a test vector signal at the first node in response to the first state of the clock signal if the scan shift signal is asserted;
latching a write mask signal at a second node in response to the first state of the clock signal if the scan shift signal is deasserted; and
latching the test vector signal at the second node in response to the first state of the clock signal if the scan shift signal is asserted.

15. The method of claim 14, further comprising:
routing the test vector signal from a scan input port to first and second latches for latching the test vector signal at the first and second nodes, respectively, in response to the scan shift signal being asserted; and decoupling the scan input port from the first and second latches in response to the scan shift signal being deasserted.

16. The method of claim 14, further comprising:

routing the data signal from a data input port to a latch for latching the data signal at the first node in response to the scan shift signal being deasserted; and decoupling the data input port from the latch in response to the scan shift signal being asserted.

17. The method of claim 14, further comprising:

routing the write mask signal from a write mask input port to a latch for latching the write mask signal at the first node in response to the scan shift signal being deasserted; and decoupling the write mask input port from the latch in response to the scan shift signal being asserted.

18. The method of claim 14, further comprising:

latching the test vector signal at a third node in response to a second state of the clock signal if the scan shift signal is asserted; and routing the latched test vector to a scan output port.

19. The method of claim 14, further comprising writing data to a memory cell based on the data signal if the write mask signal is deasserted.

20. The method of claim 14, further comprising masking a writing of data to a memory cell if the write mask signal is asserted.

\* \* \* \* \*